US009780004B2

(12) United States Patent
Greene

(10) Patent No.: US 9,780,004 B2
(45) Date of Patent: Oct. 3, 2017

(54) METHODS AND APPARATUS FOR OPTIMIZATION OF INSPECTION SPEED BY GENERATION OF STAGE SPEED PROFILE AND SELECTION OF CARE AREAS FOR AUTOMATED WAFER INSPECTION

(75) Inventor: John D. Greene, Santa Cruz, CA (US)

(73) Assignee: KLA-Tencor Corporation, Milpitas, CA (US)

( * ) Notice: Subject to any disclaimer, the term of this patent is extended or adjusted under 35 U.S.C. 154(b) by 1177 days.

(21) Appl. No.: 13/072,510

(22) Filed: Mar. 25, 2011

(65) Prior Publication Data

US 2012/0245861 A1    Sep. 27, 2012

(51) Int. Cl.
H01L 21/66 (2006.01)
(52) U.S. Cl.
CPC .................................. H01L 22/12 (2013.01)
(58) Field of Classification Search
CPC .. B82Y 10/00; B82Y 40/00; H01J 2237/2817; H01J 2237/31766; H01J 37/304; H01J 37/3174
See application file for complete search history.

(56) References Cited

U.S. PATENT DOCUMENTS 5,717,204 A *  2/1998  Meisburger et al. .......... 250/310
6,886,153 B1 *  4/2005  Bevis ............................. 716/51
2003/0063792 A1  4/2003  Hiroi et al.
2005/0033528 A1  2/2005  Toth et al.
2007/0029506 A1 *  2/2007  Zywno et al. ............. 250/491.1
2008/0250384 A1  10/2008  Duffy et al.
2009/0242761 A1  10/2009  Yeh et al.
2010/0211202 A1  8/2010  Chou et al.

FOREIGN PATENT DOCUMENTS

JP     2009-042055 A      2/2009

OTHER PUBLICATIONS

PCT International Search Report & Written Opinion for Application No. PCT/US2012/028347, Oct. 12, 2012,10 sheets.

* cited by examiner

Primary Examiner — Gregory J Toatley
Assistant Examiner — Kyle R Quigley
(74) Attorney, Agent, or Firm — Okamoto & Benedicto LLP

(57) ABSTRACT

Disclosed are apparatus and methods for the generation of a stage speed profile and/or the selection of care areas for automated wafer inspection. The stage speed profile generated corresponds to a fastest speed the inspection machine is able to inspect provided a set of care areas. The set of care areas selected correspond to specific regions on the wafer which are to be imaged in detail by the inspection machine. The apparatus and methods herein may also calculate speed of inspection and coverage (and possibly other characteristics of the inspection) for a quantity of cases, and select the best trade-off of coverage versus inspection time using a cost function. Other aspects, features, and embodiments of the invention are also disclosed.

12 Claims, 5 Drawing Sheets

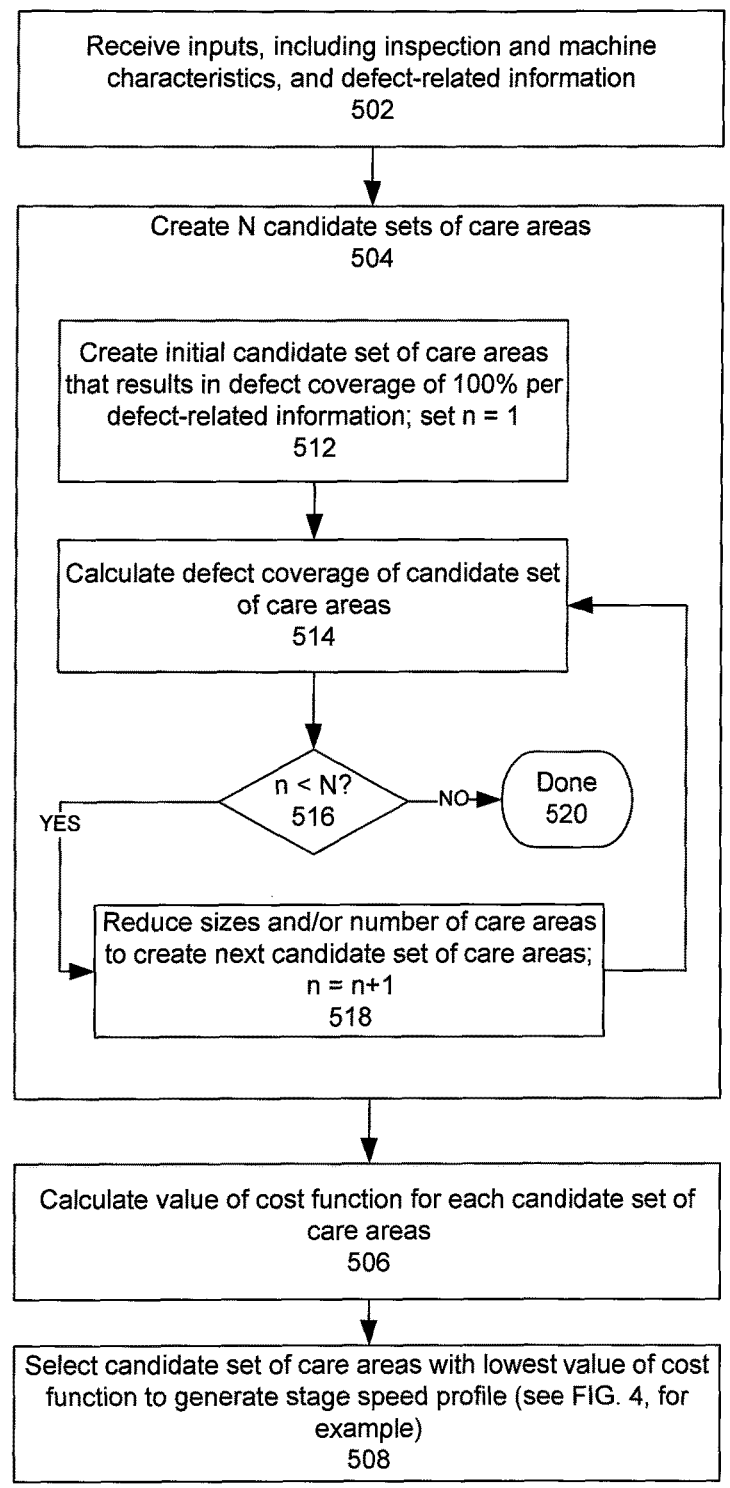
FIG. 5    500

METHODS AND APPARATUS FOR OPTIMIZATION OF INSPECTION SPEED BY GENERATION OF STAGE SPEED PROFILE AND SELECTION OF CARE AREAS FOR AUTOMATED WAFER INSPECTION

BACKGROUND OF THE INVENTION

Field of the Invention

The present invention relates generally to the automated inspection or review of defects on manufactured substrates.

Description of the Background Art

An integrated circuit (IC) design may be developed using a method or system such as electronic design automation (EDA), computer aided design (CAD), and other IC design software. Such methods and systems may be used to generate a circuit pattern database from the IC design. The circuit pattern database includes data representing a plurality of layouts for various layers of the IC. Data in the circuit pattern database may be used to determine layouts for a plurality of reticles. A layout of a reticle generally includes a plurality of shapes (polygons) that define features in a pattern on the reticle. Each reticle is used to fabricate one of the various layers of the IC. The layers of the IC may include, for example, a junction pattern in a semiconductor substrate, a gate dielectric pattern, a gate electrode pattern, a contact pattern in an inter-level dielectric, and an interconnect pattern on a metallization layer.

The term "design data" as used herein generally refers to the physical design (layout) of an IC and data derived from the physical. A semiconductor device design is verified by different procedures before production of ICs. For example, the semiconductor device design may be checked by software simulation to verify that all features will be printed correctly after lithography in manufacturing.

Fabricating semiconductor devices such as logic and memory devices typically includes processing a substrate such as a semiconductor wafer using a large number of semiconductor fabrication processes to form various features and multiple levels of the semiconductor devices. For example, lithography is a semiconductor fabrication process that involves transferring a pattern from a reticle to a resist arranged on a semiconductor wafer. Additional examples of semiconductor fabrication processes include, but are not limited to, chemical-mechanical polishing, etch, deposition, and ion implantation. Multiple semiconductor devices may be fabricated in an arrangement on a single semiconductor wafer and then separated into individual semiconductor devices.

Inspection methods are used at various steps during a semiconductor manufacturing process to detect defects on wafers to promote higher yield in the manufacturing process. As the dimensions of semiconductor devices decrease, inspection becomes even more important to the successful manufacture of acceptable semiconductor devices because smaller defects may cause the devices to fail.

It is highly desirable to improve inspection methods used during semiconductor manufacturing processes.

SUMMARY

The present patent application discloses apparatus and methods for the generation of a stage speed profile and/or the selection of care areas for automated wafer inspection. The stage speed profile generated corresponds to a fastest speed the inspection machine is able to inspect provided a set of care areas. The set of care areas selected correspond to specific regions on the wafer which are to be imaged in detail by the inspection machine. The apparatus and methods herein may also calculate speed of inspection and coverage (and possibly other characteristics of the inspection) for a quantity of cases, and select the best trade-off of coverage versus inspection time using a cost function.

Other aspects, features, and embodiments of the invention are also disclosed.

BRIEF DESCRIPTION OF THE DRAWINGS

FIG. 5 is a flow chart depicting a computer-implemented method of determining a set of care areas to be inspected in accordance with an embodiment of the invention.

Figure 1:
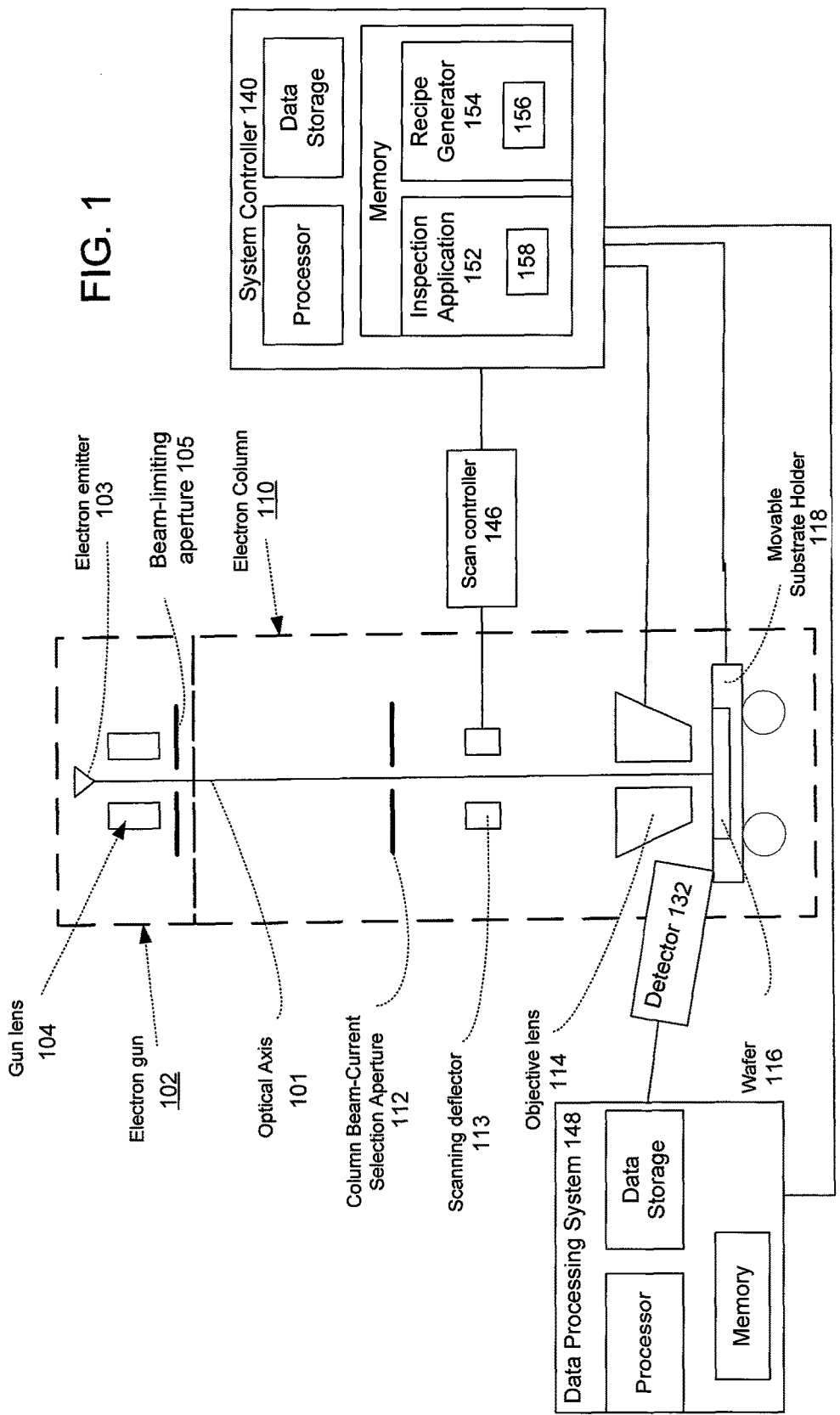
FIG. 1 is a cross-sectional diagram of a scanning electron microscope configured for automated defect inspection in accordance with an embodiment of the invention.

Note that the figures provided herewith are not necessarily to scale. They are provided for purposes of illustration to ease in the understanding of the presently-disclosed invention.

DETAILED DESCRIPTION

Inspection recipes are conventionally used for automated or semi-automated wafer inspection. Many conventional methods of generating an inspection recipe make no use of the design data associated with an integrated circuit. Recipe generation includes a trial-and-error iterative approach in which the wafer is scanned in different imaging modes and for each such scan, the detection thresholds are varied and defects manually reviewed (usually on a scanning electron microscope review station). The die is segmented into regions in a relatively broad sense (e.g., array versus logic), and the thresholds are modified (iteratively) until defects of interest are caught without detecting too many nuisance defects.

Certain existing methods for creating inspection recipes are described in U.S. Patent Application Publication No. US 2008/0250384 A1, entitled "Systems and Methods for Creating Inspection Recipes," by Brian Duffy and Ashok Kulkarni (hereinafter "Duffy"). One computer-implemented method disclosed in Duffy includes creating a mapping between design attributes and certain image characteristics of a first design, and then using the mapping learned from the first design in creating an inspection recipe for a second design.

The present patent application discloses improvements in methods and apparatus for the creation of inspection recipes. The methods and apparatus disclosed herein may utilize inspection characteristics, machine characteristics and wafer characteristics to generate an inspection recipe that optimizes a trade-off between defect coverage and throughput of the inspection apparatus.

The following assumptions and terms may be used in the following discussion.

The sample stage may be assumed to be moved continuously in the x dimension by the stage, while the beam may be moved in a raster pattern with lines in the y dimension. The stage speed in the x-dimension may be varied by applying acceleration or deceleration in the x-dimension. The acceleration and deceleration are assumed to be limited by the translation mechanism of the stage. The stage speed may be measured in meters per second.

The field of view (FOV) may be considered to be the maximum usable view area of the electron-beam imaging column with acceptable aberrations and performance of the e-beam optics. The beam may be deflected by the apparatus to any point in the FOV. While the FOV may be circular in shape, a largest inscribed square within the circle is typically used for purposes of imaging in inspection. The width of the FOV may be measured in microns.

A care area is an area of the wafer (or die on the wafer) that is desired to be inspected by the electron beam inspection (EBI) machine. In accordance with one embodiment of the invention, the extent of the care area in the x-dimension (X extent of the CAs) is of particular interest. The X extent of a CA may be measured in FOV widths.

The inspection rate is the rate at which the electron beam crosses the wafer in the x-dimension. The inspection rate may be determined by the acquisition data rate, the height of the raster scan line, and the pixel size. For example, if the data rate is 200 mega pixels per second (Mp/s), the height of the raster scan is 1000 pixels (p) high, and the pixel size is 10 nanometers (nm), then the X inspection rate is given by: (200Mp/s)/(1000p)*(10nm)=2 mm/s.

FIG. 1 is a cross-sectional diagram of a scanning electron beam (e-beam) apparatus configured for automated defect inspection in accordance with an embodiment of the invention. As shown, the e-beam apparatus includes an electron gun 102 and an electron-beam column (electron column) 110.

In the electron gun 102, the electron emitter 103 is a source of electrons, and the gun lens 104 focuses the emitted electrons to form an electron beam. The beam-limiting aperture 105 may be utilized to limit the size of the beam exiting the electron gun 102 and entering into the electron column 110 along the optical axis 101 of the column.

In the electron column 110, the column beam-current selection aperture 112 may be used to select a desired beam current with which to illuminate the target semiconductor wafer (or other target substrate) 116. A scanning deflector 113 may be configured to controllably scan (for example, raster scan) the beam across an area of the wafer 118, and a scan controller 146 may be coupled to the scanning deflector 113 and used to control said deflection.

The objective lens 114 is configured to focus the controllably deflected beam onto the wafer 116. A movable substrate holder 118 may be configured to hold the wafer 116 and transport (move) the wafer 116 under the electron column 110 for the purpose of automated inspection and/or review of defects, or automated measurement of critical dimensions, as part of a semiconductor manufacturing process.

A detector 132 is arranged to detect secondary electrons (and/or backsignal electrons), and a data processing system 148 coupled to the detector 132 is used to store and process the detected data so as to be able to form useful images for analysis. The data processing system 148 may include a processor configured to execute instructions and operate on data, memory into which executable instructions and data may be loaded, non-transitory data storage, and various other components (such as a display, user input devices, and so on).

The apparatus further includes a system controller 140. The system controller 140 may include a processor configured to execute instructions and operate on data, memory into which executable instructions and data may be loaded, non-transitory data storage, and various other components (such as a display, user input devices, and so on). The system controller 140 may be communicatively coupled to the scan controller 146, the data processing system 148, and various other components of the apparatus (such as voltage or current sources for various lenses, and so forth).

In accordance with an embodiment of the invention, the system controller 140 may include an inspection application 152 and a recipe generator 154. The inspection application 152 and the recipe generator 154 are shown in both FIGS. 1 and 2.

As shown in FIG. 1, the inspection application 152 may be loaded into the memory of the system controller 140 and may be executed by the processor of the system controller 140. The inspection application 152 may be configured to control the electron beam apparatus during inspection of the substrate. As further shown in FIG. 1, the recipe generator 154 may be loaded into the memory of the system controller 140 and may be executed by the processor of the system controller 140. In accordance with an embodiment of the invention, the recipe generator 154 may include a care area selection module 156, and the inspection application 152 may include a stage speed profile generation module 158. As described further below, the care area selection module 156 may be used to select a set of care areas, and the stage speed profile generation module 158 may be used to generate a stage speed profile for the selected set of care areas.

Figure 2:
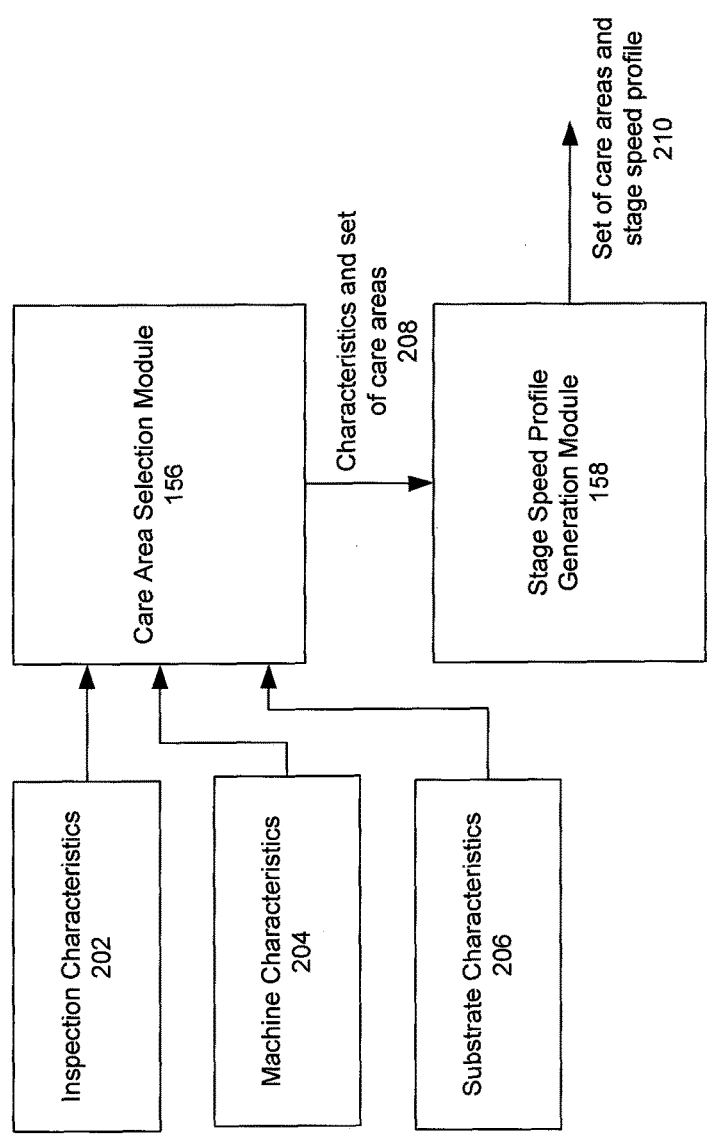
FIG. 2 is a schematic diagram showing the inputs and outputs of a care area selection module and a stage speed profile generation module in accordance with an embodiment of the invention.

As shown in FIG. 2, the care area selection module 156 may be configured to receive inspection characteristics 202, machine characteristics 204 and substrate (wafer) characteristics 206 and select a set of care areas. The aforementioned characteristics (202, 204 and 206) and the set of care areas may then be output 208 to the stage speed profile generation module 158. The stage speed profile generation module 158 may then generate a stage speed profile for the set of care areas in a way that optimizes a trade-off between multiple factors, such as, for example, defect coverage, sensitivity and throughput of the inspection apparatus. The stage speed profile generation module 158 may then output 210 the set of care areas and the corresponding stage speed profile to be used by other modules of the inspection application 152.

The selected set of care areas indicates the regions to be sampled (the "care areas") and further indicates an order for imaging these regions to be sampled. In accordance with an embodiment of the invention, the care areas in the set may represent a small fraction of the total area of the manufactured substrate so as to provide increased inspection throughput. In some cases, a combined area of the care areas for a manufactured substrate may be less than one percent of a total area of the surface of the manufactured substrate. The stage speed profile indicates various speed levels over time for translating the stage in order to image the set of care areas.

Figure 3:
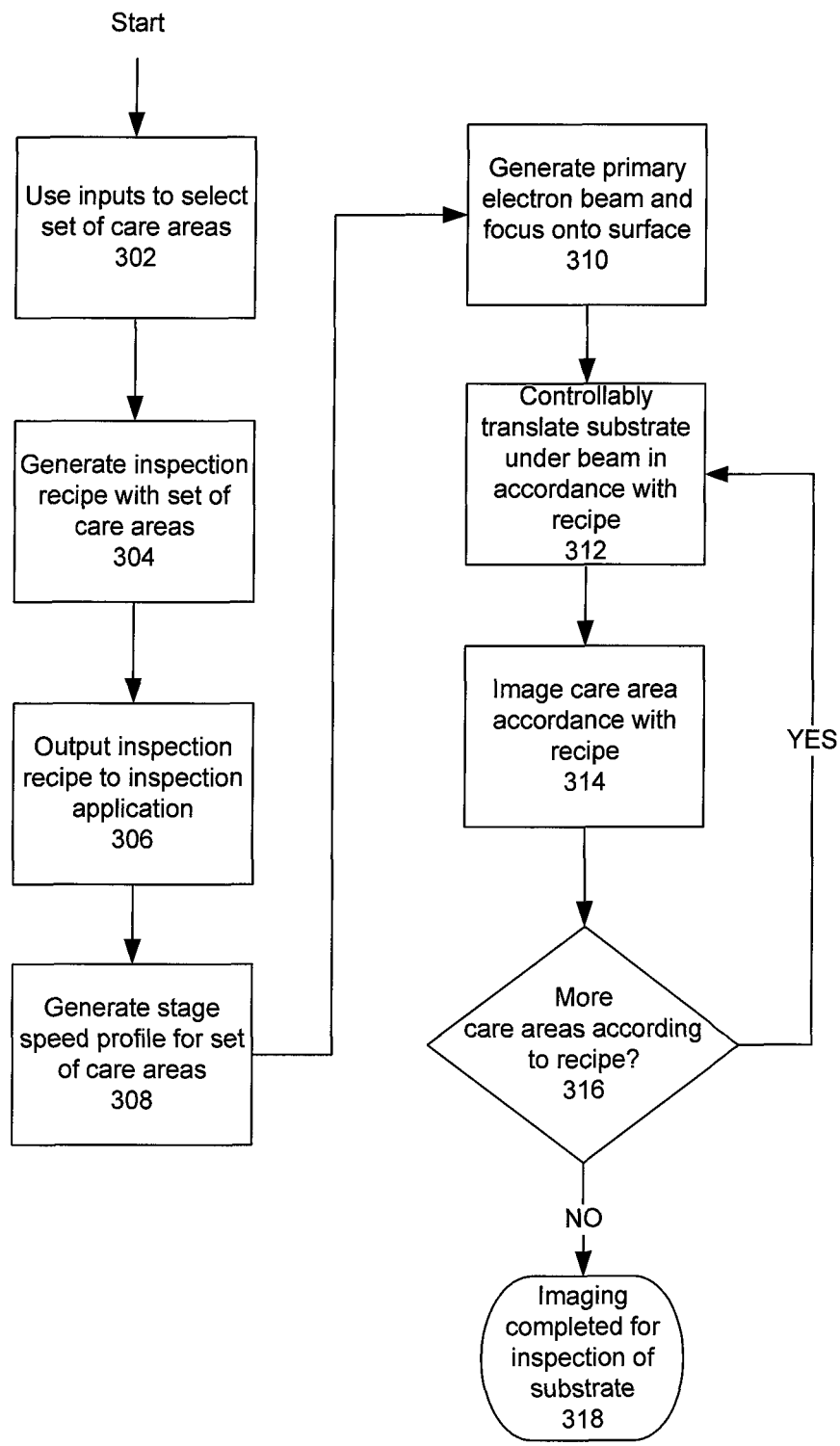
FIG. 3 is a flow chart depicting a method of automated inspection of a manufactured substrate in accordance with an embodiment of the invention.

FIG. 3 is a flow chart depicting a method 300 of automated inspection of a manufactured substrate in accordance with an embodiment of the invention. The method 300 may be performed, for example, by the electron beam apparatus described above in relation to FIGS. 1 and 2.

Per block 302, various inputs may be received by the care area selection module 156. These inputs may include the above-mentioned inspection characteristics 202, machine characteristics 204 and wafer characteristics 206. These characteristics may be used to select a set of care areas, such as, for example, by the procedure 500 described below in relation to FIG. 5.

Per block 304, the inspection recipe generator 154 may use the selected set of care areas to generate an inspection recipe. The inspection recipe may include, in addition to information relating to the care areas, various other parameters and data relating to the inspection. For example, the inspection recipe may provide: (i) registration data indicating how to register (align) to a die pattern when the wafer is first loaded into the inspector; (ii) a sample plan which indicates which dice to inspect on the wafer; (iii) pixel size, beam current, data rate, and number of scan averages; (iv) column conditions, such as wehnelt/extraction voltage and landing energy; (v) parameters such as contrast settings, alignment sites to be used for premapping, etc.; (vi) post-processing parameters such as binning information for found defects; and other parameters and data.

Per block 306, the inspection recipe may be output from the recipe generator 154 to the inspection application 152. In one implementation, both the recipe generator 154 and the inspection application 152 may be executed on a system controller 140 for the electron beam inspection apparatus.

Per block 308, a stage speed profile generation module 158 of the inspection application 152 may generate a stage speed profile based on the selected set of care areas. One procedure 400 for generating the stage speed profile is described below in relation to the flow chart of FIG. 4. Per block 310, a primary electron beam is generated and focused onto the surface of the substrate to be inspected. For example, the substrate may be a semiconductor wafer being manufactured.

Per block 312, the substrate is controllably translated under the primary electron beam in accordance with the inspection recipe and the stage speed profile. The translation may be controlled, for example, so as to center each region to be sampled (also referred to herein as a "care area"), in turn, within the field of view of the imaging apparatus.

Per block 314, the care area is imaged by scanning the primary electron beam over the care area and detecting emitted electrons in a synchronized manner with said scanning. Said scanning may involve scanning a series of swaths until the care area is covered.

Per block 316, a determination may then be made as to whether or not there are more care areas according to the inspection recipe. If there are more care areas according to the inspection recipe, then the method 300 loops back to block 312. If there are no more care areas according to the inspection recipe, then the imaging is completed for the inspection of the substrate per block 318.

Figure 4:
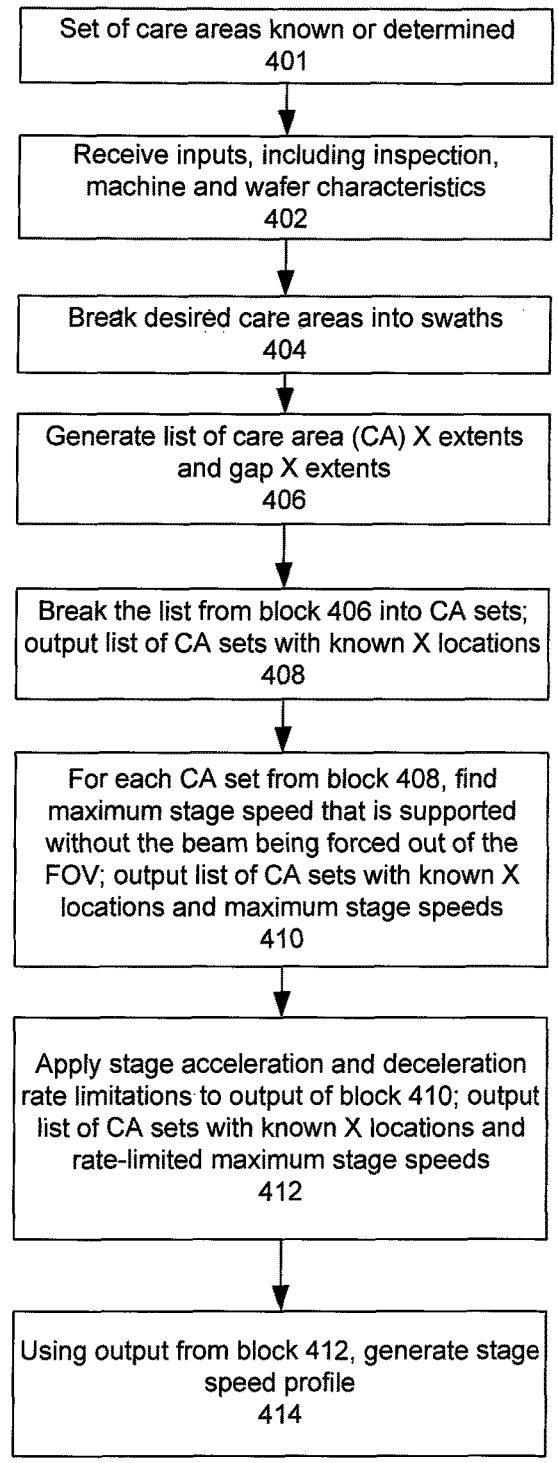
FIG. 4 is a flow chart depicting a computer-implemented method of generating a stage speed profile corresponding to a set of care areas in accordance with an embodiment of the invention.

FIG. 4 is a flow chart depicting a computer-implemented method 400 of generating a stage speed profile corresponding to a set of care areas in accordance with an embodiment of the invention. This method 400 begins in block 401 with the set of care areas (the regions of interest to be imaged) being known or determined. In accordance with one embodiment of the invention, the care areas may be determined using the method 500 described below in relation to FIG. 5.

Per block 402, various inputs are received. These inputs may include inspection characteristics, machine characteristics, and wafer characteristics. The inspection characteristics may include, for example, pixel size, data rate, and scan height. The machine characteristics may include, for example, field of view dimensions, stage acceleration capabilities, and maximum stage speed. The wafer characteristics may include location information (for example, x-y location data) of the care areas. (The care area location information is already known or determined per block 401.)

Per block 404, the care areas may be broken or divided into swaths. Each swath is an area scanned by the electron beam while the wafer is being translated. In particular, each swath may be a parallelogram-shaped area being scanned (with raster lines along the y-dimension) while the wafer is being translated linearly (along the x-dimension).

Per block 406, a list may be generated of care area x-dimension extents (CA X extents) and gap x-dimension extents (gap X extents). In one embodiment, such a list may be generated for each die on the wafer. A CA X extent is a range in the x-dimension that is spanned by a care area, and a gap X extent is a range in the x-dimension that is between adjacent care area x-dimension extents. If there are M care areas in a die swath, then there will be M−1 gaps. In some instances, the care areas and gaps may be in a regular, periodic pattern. In other instances, the care areas and gaps may be non-periodic. An example of a list of CAs and gaps is (0.5, 0.1, 0.5, 0.1, 0.5). In this example, there are three CAs, each 0.5 FOV widths wide, and there are two gaps therebetween, each 0.1 FOV widths wide.

Per block 408, the list of CA X extents and gap X extents from block 406 is broken or divided into care area sets (CA sets). A CA set is a group of care areas that has no gap X extent greater than one width of the field of view (FOV) in the x-dimension. In other words, a CA set is a group of care areas that are closely-spaced in the x-dimension such that no gap between neighboring care areas in the set is greater than the width of the FOV in the x-dimension. The list of CA sets and their known locations (ranges) in the x-dimension may then be output.

Per block 410, for each CA set from block 408, a maximum stage speed is found. In particular, the maximum stage speed is the fastest speed of stage translation in the x-direction that is supported without the electron beam being forced out of the field of view. Consider a scanning mode with a constant stage speed when the position of the stage in the x-dimension is within a CA set.

In that case, to determine the maximum stage speed for a CA set, a maximum stage speed for each CA subset may be calculated, and the slowest of these calculated speeds may be selected as the maximum stage speed for the CA set. For example, consider a CA set which includes the following sequence of neighboring care areas: CA1; CA2; CA3; . . . ; CA(n−1); and CAn. CA subsets may then include: CA1-CA2; CA1-CA3; CA1-CA4; . . . ; CA1-CAn; CA2-CA3; CA2-CA4; CA2-CA5; . . . ; CA2-CAn; . . . ; CA(n−2)-CA(n−1); CA(n−2)-CAn; CA(n−1)-CAn. In this example, a maximum stage speed for each of these CA subsets may be calculated, and the slowest of these calculated speed may be selected as the maximum stage speed for the CA set. The list of CA sets with their known locations (ranges) in the x-dimension and their maximum stage speeds may then be output.

Per block 412, stage acceleration or deceleration rate limitations are applied. In accordance with one embodiment, an iterative procedure may be used to apply these rate limitations. The iterative procedure may start with the CA set with the lowest maximum stage speed. Acceleration or deceleration rates, as appropriate, may then be applied between this CA set and all other CA sets. In one embodiment, the stage acceleration and deceleration may follow S-curve profiles, where the stage speed may vary as a cubic function with respect to time. If the maximum stage speed for one of the other CA sets is not possible to achieve due to the finite gap sizes and acceleration or deceleration rate limitations, then the maximum stage speed for that CA set is reduced (limited) so as to be achievable. The iterative procedure may then go to the CA set with the next lowest maximum stage speed and determine any rate-limited reductions of the maximum stage speeds for the other CA sets. In this manner, the iterative procedure steps through each CA set in the entire list of CA sets from lowest speed to highest speed, applying acceleration/deceleration rate limits to every CA set as may be required. The list of CA sets with their known locations (ranges) in the x-dimension and their rate-limited maximum stage speeds may then be output.

Finally, per block 414, a stage speed profile may be generated using the output from block 412. In one embodiment, the stage speed profile may give the desired stage speed as a function of location in the x-dimension for each die. Higher-level control software in the inspection application may link the dies into die rows, as appropriate. This stage speed profile effectively gives a fastest speed allowable that covers the care areas in a die while keeping the electron beam within the field of view of the electron-optics of the column.

FIG. 5 is a flow chart depicting a computer-implemented method 500 of determining a set of care areas to be inspected in accordance with an embodiment of the invention. The care areas determined by this method 500 may be used in the method 400 of generating an inspection recipe per FIG. 4.

Per block 502, inputs are received including, for example, inspection characteristics, machine characteristics, and defect-related information. The inspection characteristics may include, for example, pixel size, data rate, and scan height. The machine characteristics may include, for example, field of view, stage acceleration capability, and maximum stage speed.

The defect-related information may be obtained from either 1) a pre-inspection that finds "hot spots" that appear to be the most valuable locations to inspect, or 2) a user of the method. The defect-related information does not include care areas per se; however, the defect-related information is used to determine the care areas. The defect-related information may include, for example, defect locations found from pre-inspection results, defect density as a function of x-y location, and defect classification information. Defect-related information from a user may be based on information relating to design weak points, user experience, or other reasons.

In accordance with one embodiment, the defect-related information may classify locations on a die into categories or assign weights to x-y locations. For example, a first category may be for locations that "must be inspected" by electron-beam inspection (EBI), a second category may be for locations with a "high weight" for EBI, and a third category may be for locations with a "low weight" for EBI. For example, a weight of 100% for a location may indicate that this location must be inspected, while a weight of 0% for a location may indicate that this location may be ignored (not inspected).

Per block 504, the method 500 may use the inputs to create a plurality of N candidate sets of care areas. The candidate sets may have different defect coverage percentages. In accordance with one embodiment, the N candidate inspection recipes may be created by the procedure indicated in blocks 512 through 520.

Per block 512, an initial candidate set of care areas is created. In this embodiment, the initial candidate set of care areas is a set of care areas that results in complete (one hundred percent) coverage of defects per the defect-related information. For example, the initial set of care areas may cover all locations with a non-zero weighting for EBI. A variable n may be set to one to indicate that one candidate set has been created.

Per block 514, a calculation is made to calculate the defect coverage of the candidate set of care areas. The defect coverage may be 100% for the initial candidate set and less than 100% for other candidate sets.

Per block 516, a determination may be made as to whether n is less than N. If n is less than N, then there are more candidate sets to be created, so the procedure continues to block 518. Otherwise, if n is equal to N, then the procedure is done 520 creating the N candidate sets of care areas. Per block 518, a next candidate set of care areas is created by reducing the sizes and/or number of care areas in the current candidate set. The variable n may then be incremented by one to indicate that another candidate set has been created. The procedure then loops back to block 514.

After the N candidate sets of care areas are created per block 504, the method 500 performs the step in block 506. Per block 506, the value of a cost function is calculated for each candidate set of care areas. For example, the cost function may take into account an estimate of a time needed to inspect the candidate set of care areas and the proportion of areas of interest (or defects of interest) that are covered by the candidate set. The longer time needed to inspect, the higher the value of the cost function, and the less the defect coverage, the higher the value of the cost function.

Per block 508, the candidate set of care areas with the lowest value of the cost function may be selected to generate the stage speed profile (i.e. the inspection recipe). The stage speed profile may be generated using the method 400 of FIG. 4, for example.

Alternatively, instead of selecting a single candidate set of care areas, multiple candidate sets which have low values of the cost function may be selected. These multiple candidate sets may then be used to generate corresponding stage speed profiles, and a user may be allowed to select one of the stage speed profiles for use in the inspection recipe.

One embodiment relates to an apparatus configured for the automated inspection of a manufactured substrate. The apparatus may include a care area selection module and a stage speed profile module. The care area selection module is configured to select a set of care areas which are regions to be imaged by the apparatus. The stage speed profile generation module is configured to generate a stage speed profile which corresponds to the fastest speed the inspection machine is able to inspect a provided set of care areas.

Another embodiment relates to a computer-implemented method. In this method, inspection characteristics, machine characteristics, and wafer characteristics are received by a care area selection module of a recipe generator. The care area selection module uses the characteristics to select a set of care areas. The method may also use a stage speed profile generation module to generate a stage speed profile which corresponds to the set of care areas. The method may also calculate speed of inspection and coverage (and possibly other characteristics of the inspection) for a quantity of cases, and select the best trade-off of coverage vs inspection time using a cost function.

In the above description, numerous specific details are given to provide a thorough understanding of embodiments of the invention. However, the above description of illustrated embodiments of the invention is not intended to be exhaustive or to limit the invention to the precise forms disclosed. One skilled in the relevant art will recognize that the invention can be practiced without one or more of the specific details, or with other methods, components, etc. In other instances, well-known structures or operations are not shown or described in detail to avoid obscuring aspects of the invention. While specific embodiments of, and examples for, the invention are described herein for illustrative purposes, various equivalent modifications are possible within the scope of the invention, as those skilled in the relevant art will recognize.

These modifications can be made to the invention in light of the above detailed description. The terms used in the following claims should not be construed to limit the invention to the specific embodiments disclosed in the specification and the claims. Rather, the scope of the invention is to be determined by the following claims, which are to be construed in accordance with established doctrines of claim interpretation.

What is claimed is:

1. An apparatus for inspecting scattered areas on a surface of a manufactured substrate, the apparatus comprising:
a source for generating a beam;
a lens system configured to focus the beam onto a surface of the substrate;
a detector configured to detect radiation emitted from the substrate as a result of the beam impinging onto the surface;
a stage configured to hold the substrate and controllably move the substrate under the beam;
a system controller that executes an inspection application and a recipe generator, wherein the inspection application controls the apparatus during inspection of the substrate, wherein the recipe generator includes a care area selection module which receives inspection characteristics, machine characteristics, and wafer characteristics, and uses said characteristics to select a set of care areas for use by the inspection application; and
a stage speed profile generation module of the inspection application, wherein the stage speed profile generation module divides care areas to be inspected into swaths to be scanned, generates a list of care area extents and gap extents, and divides the list of care area extents and gap extents into groups of care areas that have no gap extent in a first dimension greater than one width of a field of view of the apparatus in the first dimension.

2. The apparatus of claim 1, wherein the care area selection module creates a plurality of candidate sets of care areas spanning a range of defect coverage percentages.

3. The apparatus of claim 2, wherein the care area selection module selects the candidate set which results in a lowest value of a cost function.

4. The apparatus of claim 3, wherein the cost function is higher when a calculated time needed to inspect the candidate set is longer and is higher when a defect coverage percentage is lower.

5. The apparatus of claim 1, wherein the stage speed profile generation module finds a maximum stage speed for each said group of care areas, applies acceleration and deceleration rate limitations to the maximum stage speed to determine a rate-limited maximum stage speed for each said group of care areas, and generates a stage speed profile using the rate-limited maximum stage speeds for the groups of care areas.

6. A computer-implemented method comprising:
executing a recipe generator on a computer system coupled to an electron beam inspection apparatus;
receiving inspection characteristics, machine characteristics, and wafer characteristics by a care area selection module of the recipe generator;
selecting a set of care areas by the care area selection module using the inspection characteristics, machine characteristics, and wafer characteristics;
receiving the set of care areas by a stage speed profile generation module; and
generating a stage speed profile by the stage speed profile generation module using the set of care areas by dividing the care areas into swaths to be scanned, generating a list of care area extents and gap extents, and dividing the list of care area extents and gap extents into groups of care areas that have no gap extent in a first dimension greater than one width of a field of view in the first dimension.

7. The computer-implemented method of claim 6, wherein selecting the set of care areas by the care area selection module comprises:
creating a plurality of candidate sets of care areas spanning a range of defect coverage percentages.

8. The computer-implemented method of claim 7, wherein selecting the set of care areas by the care area selection module further comprises:
selecting the candidate set which results in a lowest value of a cost function.

9. The computer-implemented method of claim 8, wherein the cost function is higher if a calculated time needed to inspect the candidate set is longer and is higher if a defect coverage percentage is lower.

10. The computer-implemented method of claim 6, wherein generating the stage speed profile by the stage speed profile generation module further comprises:
applying acceleration and deceleration rate limitations to the maximum stage speed to determine a rate-limited maximum stage speed for each said group of care areas.

11. The computer-implemented method of claim 10, wherein generating the stage speed profile by the stage speed profile generation module further comprises:
generating a stage speed profile using the rate-limited maximum stage speeds for the groups of care areas.

12. A computer-implemented method of generating a stage speed profile, the method comprising:
receiving a set of care areas;
dividing the care areas into swaths to be scanned;
generating a list of care area extents and gap extents;
dividing the list of care area extents and gap extents into groups of care areas that have no gap extent in a first dimension greater than one width of a field of view in the first dimension;
applying acceleration and deceleration rate limitations to the maximum stage speed to determine a rate-limited maximum stage speed for each said group of care areas; and
generating the stage speed profile using the rate-limited maximum stage speeds for the groups of care areas.

* * * * *